US012608512B2

(12) United States Patent
Schaumann et al.

(10) Patent No.: US 12,608,512 B2
(45) Date of Patent: Apr. 21, 2026

---

(54) TECHNIQUES FOR IMPROVING OCCUPANCY SIMULATIONS AND OPTIMIZING SPACE UTILIZATION

(71) Applicant: The Joan and Irwin Jacobs Technion-Cornell Institute, New York, NY (US)

(72) Inventors: Davide Schaumann, New York, NY (US); Pierre Pasquet, New York, NY (US)

(73) Assignee: The Joan and Irwin Jacobs Technion-Cornell Institute, New York, NY (US)

( * ) Notice: Subject to any disclaimer, the term of this patent is extended or adjusted under 35 U.S.C. 154(b) by 1136 days.

(21) Appl. No.: 17/499,114

(22) Filed: Oct. 12, 2021

(65) Prior Publication Data

US 2022/0114297 A1 Apr. 14, 2022

Related U.S. Application Data

(60) Provisional application No. 63/090,425, filed on Oct. 12, 2020.

(51) Int. Cl.
*G06F 30/13* (2020.01)

(52) U.S. Cl.
CPC .................................... *G06F 30/13* (2020.01)

(58) Field of Classification Search
CPC ....................................................... G06F 30/13
See application file for complete search history.

(56) References Cited

U.S. PATENT DOCUMENTS

| | | | |
|---|---|---|---|
| 6,216,098 | B1 | 4/2001 | Clancey et al. |
| 10,380,506 | B2 | 8/2019 | Goldstein et al. |
| 2013/0041632 | A1 | 2/2013 | Goldstein et al. |
| 2013/0041643 | A1 | 2/2013 | Goldstein et al. |
| 2015/0310447 | A1 | 10/2015 | Shaw |

(Continued)

FOREIGN PATENT DOCUMENTS

KR 102181197 B1 11/2020

OTHER PUBLICATIONS

Chen Yixing et al: "An agent-based stochastic Occupancy Simulator", Building Simulation, Tsinghua University Press, Heidleberg, vol. 11, No. 1, Jun. 1, 2017 (Jun. 1, 2017), pp. 37-49, XP037101615, ISSN: 1996-3599, DOI: 10.1007s12273-017-0379-7 [retrieved on Jun. 1, 2017] *chapters 2.3 to 3.4; figures 1-15*.

(Continued)

*Primary Examiner* — Bijan Mapar
(74) *Attorney, Agent, or Firm* — M&B IP Analysts, LLC

(57) ABSTRACT

A system and method for improved occupancy simulations. A method includes executing a scheduler algorithm based on input data in order to output a plurality of synthetic schedules, wherein the input data includes space data, persona data, and work pattern data, wherein the scheduler algorithm includes a plurality of sub-algorithms executed according to an order of priority, wherein at least an output of one of the plurality of sub-algorithms is input to another of the plurality of sub-algorithms; and inputting the plurality of synthetic schedules to a simulation engine, wherein the simulation engine runs a plurality of simulations using the plurality of synthetic schedules.

21 Claims, 6 Drawing Sheets

(56) References Cited

U.S. PATENT DOCUMENTS

| | | | |
|---|---|---|---|
| 2019/0361407 A1* | 11/2019 | Vogel | G01R 22/10 |
| 2020/0034503 A1 | 1/2020 | Livnat | |
| 2021/0041759 A1 | 2/2021 | Trikha et al. | |
| 2021/0174273 A1 | 6/2021 | Olson et al. | |
| 2021/0306169 A1 | 9/2021 | Scifres et al. | |
| 2021/0311600 A1 | 10/2021 | Bacon et al. | |
| 2021/0314160 A1 | 10/2021 | Suresh et al. | |

OTHER PUBLICATIONS

Extended European Search Report for EP 21879629.0 dated Oct. 7, 2024. European Patent Office, Munich, Germany.

Date Kartikeya, Schaumann Davide, Kalay Yehuda. "A Parametric Approach to Simulating Use-Patterns in Buildings: The Case of Movement". Education and research in Computer Aided Architectural Design in Europe (eCAADe). Rome, Italy.

Date Kartikeya, Schaumann Davide, Kalay Yehuda. "Modeling Space to Support Use-Pattern Simulation in Buildings" Symposium on Simulation for Architecture and Urban Design (SimAUD). Toronto, Canada.

Esposito Dario, Schaumann Davide, Camarda Domenico, Kalay Yehuda. "Multi-agent modeling and simulation of hospital acquired infection propagation dynamics by contact transmission in hospital wards". International Conference on Practical Applications of Agents and Multi-Agent Systems.

Gath Morad Michal, Schaumann Davide, Zinger Einat, Pnina O. Plaut, Yehuda E. Kalay, "How Smart is The Smart City? Assessing the Impact of ICT on Cities". Lecture notes in Artificial intelligence, Springer.

Hong Seung Wan, Kalay Yehuda E., Schaumann Davide. "The Effects of Human Behavior Simulation on Architectural Design Education". 20th Annual Conference on Computer-Aided Architectural Design Research in Asia (CAADRIA 2015).

Hong Seung Wan, Schaumann Davide, Kalay Yehuda E. "Human Behavior Simulation in Architectural Design Project: an Observational Study in an Academic Course." Computers, Environment and Urban Systems, 60.

Kalay Yehuda E., Schaumann Davide, Hong Seung Wan, Simeone Davide. "Beyond BIM: next-generation building information modeling, to support form, function, and use of buildings". In Building Information Modeling: BIM in Current and Future Practice, Chapter 24, John Wiley & Sons, Inc.

Michal Gath-Morad, Einat Zinger, Davide Schaumann, Nirit Putievsky Pilosof, Yehuda E. Kalay. "A Dashboard Model to Support Spatio-Temporal Analysis of Simulated Human Behavior in Future Built Environments". Symposium on Simulation for Architecture and Urban Design (SimAUD). Delft, Netherlands.

Schaumann Davide, Breslav Simon, Goldstein Rhys, Kahn Azam, Kalay Yehuda. "Simulating the Behavior of Building Occupants using Multi-agent Narratives: A Preliminary Study in a Generic Hospital Ward". Building Simulation conference (IBPSA). San Francisco, USA.

Schaumann Davide, Breslav Simon, Goldstein Rhys, Kahn Azam, Kalay Yehuda. "Simulating use scenarios in hospitals using multi-agent narratives". Journal of Building Performance Simulation 10 (5-6).

Schaumann Davide, Date Kartikeya, Kalay Yehuda. "An Event Modeling Language (EML) to simulate use patterns in built environments". Symposium on Simulation for Architecture and Urban Design (SimAUD). Toronto, Canada.

Schaumann Davide, Gath Morad Michal, Zinger Einat, Putievsky Pilosof Nirit, Sopher Hadas, Brodeschi Michal, Date Kartikeya, Kalay Yehuda E. "A Computational Framework to Simulate Human Spatial Behavior in Built Environments". Symposium on Simulation for Architecture and Urban Design (SimAUD 2016).

Schaumann Davide, Kalay Yehuda E., Hong Seung Wan, Simeone Davide. "Simulating Human Behavior in not-yet Built Environments by means of Event-based Narratives". Symposium on Simulation for Architecture and Urban Design (SimAUD 2015). SimAUD 2015 Best Paper Award + SpringSim 2015 Best Paper for Modeling & Simulation Practice.

Schaumann Davide, Kalay Yehuda. Hong Seung Wan. "A Form-Function-Use (FFU) model to simulate human behavior in built environments". Envisioning Architecture (EAEA). Glasgow, Scotland.

Schaumann Davide, Moon Seonghyeon, Usman Muhammad, Goldstein Rhys, Breslav Simon, Khan Azam, Faloutsos Petros, Kapadia Mubbasir. "Towards a Multi-Level and Multi-Paradigm Platform for Building Occupant Simulation". Symposium on Simulation for Architecture and Urban Design (SimAUD). Atlanta, Georgia, USA.

Schaumann Davide, Putievsky Pilosof Nirit, Date Kartikeya, Kalay Yehuda E. "A study of human behavior simulation in Architectural Design of Hospital Facilities". Annali dell'Istituto Superiore di Sanità, 52 (01).

Schaumann Davide, Putievsky Pilosof Nirit, Gath-Morad Michal, Kalay Yehuda. "Simulating the impact of facility design on operations: A study in an internal medicine ward". Facilities. vol. 38 No. 7/8, pp. 501-522. Publication: Feb. 21, 2020.

Schaumann Davide, Putievsky Pilosof Nirit, Sopher Hadas, Yahav Jacob, Kalay Yehuda E. "Simulating Multi-Agent Narratives for Pre-Occupancy Evaluation of Architectural Designs". Automation in Construction. vol. 106. Jul. 9, 2019.

Simeone Davide, Cursi Stefano, Toldo Ilaria, Schaumann Davide. "A simulation model for building occupancy prediction". TeMA—Tempo, Materia e Architettura. 1 (02).

Simeone Davide, Kalay Yehuda E., Schaumann Davide. "Modelling and Simulating Use Processes in Buildings", in Computation and Performance, Proceedings of the 31st eCAADe Conference, Delft University of Technology.

Simeone Davide, Kalay Yehuda E., Schaumann Davide. "Using game-like narrative to simulate human behaviour in built environments". Open Systems: Proceedings of the 18th International Conference on Computer-Aided Architectural Design Research in Asia (CAADRIA 2013), Singapore, pp. 199-208.

Simeone Davide, Schaumann Davide, Kalay Yehuda E., Carrara Gianfranco. "Adding Users' Dimension to BIM", in Envisioning Architecture: Design, Evaluation, Communication—Proceedings of the 11th Conference of the European Architectural Envisioning Association (EAEA), Milan.

Sopher Hadas, Schaumann Davide, Kalay Yehuda. "Simulating Human Behavior in (un)Built Environments: Using an Agent's Knowledge Model". International conference on spatial cognition (ICSC). Miami, USA.

Zhang Xun, Schaumann Davide, Faloutsos Petros, Kapadia Mubbasir, "Knowledge-Powered Inference of Crowd Behaviors in Semantically Rich Environments". Proceedings of the 15th AAAI Conference on Artificial Intelligence and Interactive Digital Entertainment (AIIDE). Atlanta, GA, USA.

Zhang Xun, Schaumann Davide, Haworth Brandon, Faloutsos Petros, Kapadia Mubbasir, "Coupling Agent Motivations and Spatial Behaviors for Authoring Multi-Agent Narratives". Computer Animation and Virtual Worlds. 30. vol. 30 No. 3-4, pp. 26 Jun. 2019.

Zhang Xun, Schaumann Davide, Haworth Brandon, Faloutsos Petros, Kapadia Mubbasir, "Multi-Constrained Authoring of Occupant Behavior Narratives in Architectural Design". Symposium on Simulation for Architecture and Urban Design (SimAUD). Atlanta, Georgia, USA.

International Search Report and Written Opinion of International Searching Authority for PCT/IB2021/059358, ISA/RU, Moscow, Russia, Dated: Nov. 29, 2021.

* cited by examiner

600

610

TECHNIQUES FOR IMPROVING OCCUPANCY SIMULATIONS AND OPTIMIZING SPACE UTILIZATION

CROSS-REFERENCE TO RELATED APPLICATIONS

This application claims the benefit of U.S. Provisional Application No. 63/090,425 filed on Oct. 12, 2020, the contents of which are hereby incorporated by reference.

TECHNICAL FIELD

The present disclosure relates generally to computerized simulations of spaces, and more specifically to improved techniques for computerized simulation and optimization.

BACKGROUND

In places such as office buildings or other process-driven facilities, there is a need for optimizing the use of space. This may provide benefits such as improving employee productivity and experience, optimizing process efficiency, decreasing overhead costs, and the like. Examples of facilities in which space optimization may be desirable include office spaces, warehouses, distribution centers, and hospitals. Spaces in such facilities tend to be expensive, improperly utilized (i.e., either overutilized or underutilized), and unsafe, particularly during global pandemics. This makes operations less efficient, increases risk to people in the space, and decreases employee satisfaction.

Additionally, in the wake of the novel strain of Coronavirus (COVID-19) pandemic, there is an increasing need to optimize space to ensure that employees are properly spaced out while working, particularly during pandemics in which disease spreads quickly without proper spacing of employees. Such spacing may be needed to prevent or mitigate the spread of airborne diseases, especially during pandemics or other outbreaks of disease.

Moreover, the COVID-19 pandemic has accelerated a shift towards employees increasingly working remotely. In light of these changes, companies are increasingly offering hybrid work in which employees work from home on certain days and in the office on other days. Remote and hybrid work are driving down physical occupancy of employees within offices. However, although the average number of employees in the office is reduced for companies using these models, companies face challenges due to tension between ensuring that ample office space is available to employees and minimizing waste due to owning or renting frequently unoccupied space. Having a thorough understanding of potential occupancy numbers is key to making the most efficient use of office space.

Some existing solutions for improving space utilization include using data collected from sensors deployed in the space, taking surveys from people occupying the space, and evaluating process models which indirectly demonstrate likely movements around the space. Although solutions involving sensors and surveys may help in evaluating the effectiveness of space utilization in a specific facility, those solutions do not provide forward-thinking information which can be used to improve how the space is used by the inhabitants. In other words, these solutions do not address the root cause of inefficient space use. Solutions involving process models may help to evaluate the impact of a task to be performed in the space, but do not account for complex and dynamic interactions caused due to multiple tasks being performed in the space at or around the same time.

Other existing solutions simulate the movement of generic crowds to analyze density or pathways on a floorplan in order to provide space management and planning insights. However, these solutions are typically limited to specific aspects of space utilization under specific scenarios (e.g., emergency egress), and cannot efficiently, effectively, and flexibly simulate real-world interactions of people moving within a space.

It would therefore be advantageous to provide a solution that would overcome the challenges noted above.

SUMMARY

A summary of several example embodiments of the disclosure follows. This summary is provided for the convenience of the reader to provide a basic understanding of such embodiments and does not wholly define the breadth of the disclosure. This summary is not an extensive overview of all contemplated embodiments, and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the term "some embodiments" or "certain embodiments" may be used herein to refer to a single embodiment or multiple embodiments of the disclosure.

Certain embodiments disclosed herein include a method for improved occupancy simulations. The method comprises: executing a scheduler algorithm based on input data in order to output a plurality of synthetic schedules, wherein the input data includes space data, persona data, and work pattern data, wherein the scheduler algorithm includes a plurality of sub-algorithms executed according to an order of priority, wherein at least an output of one of the plurality of sub-algorithms is input to another of the plurality of sub-algorithms; and inputting the plurality of synthetic schedules to a simulation engine, wherein the simulation engine runs a plurality of simulations using the plurality of synthetic schedules.

Certain embodiments disclosed herein also include a non-transitory computer readable medium having stored thereon causing a processing circuitry to execute a process, the process comprising: executing a scheduler algorithm based on input data in order to output a plurality of synthetic schedules, wherein the input data includes space data, persona data, and work pattern data, wherein the scheduler algorithm includes a plurality of sub-algorithms executed according to an order of priority, wherein at least an output of one of the plurality of sub-algorithms is input to another of the plurality of sub-algorithms; and inputting the plurality of synthetic schedules to a simulation engine, wherein the simulation engine runs a plurality of simulations using the plurality of synthetic schedules.

Certain embodiments disclosed herein also include a system for improved occupancy simulations. The system comprises: a processing circuitry; and a memory, the memory containing instructions that, when executed by the processing circuitry, configure the system to: execute a scheduler algorithm based on input data in order to output a plurality of synthetic schedules, wherein the input data includes space data, persona data, and work pattern data, wherein the scheduler algorithm includes a plurality of sub-algorithms executed according to an order of priority, wherein at least an output of one of the plurality of sub-algorithms is input to another of the plurality of sub-algorithms; and input the plurality of synthetic schedules to a simulation engine, wherein the simulation engine runs a plurality of simulations using the plurality of synthetic schedules.

BRIEF DESCRIPTION OF THE DRAWINGS

The subject matter disclosed herein and other objects, features, and advantages of the disclosed embodiments will be apparent from the following detailed description taken in conjunction with the accompanying drawings.

DETAILED DESCRIPTION

Figure 1:
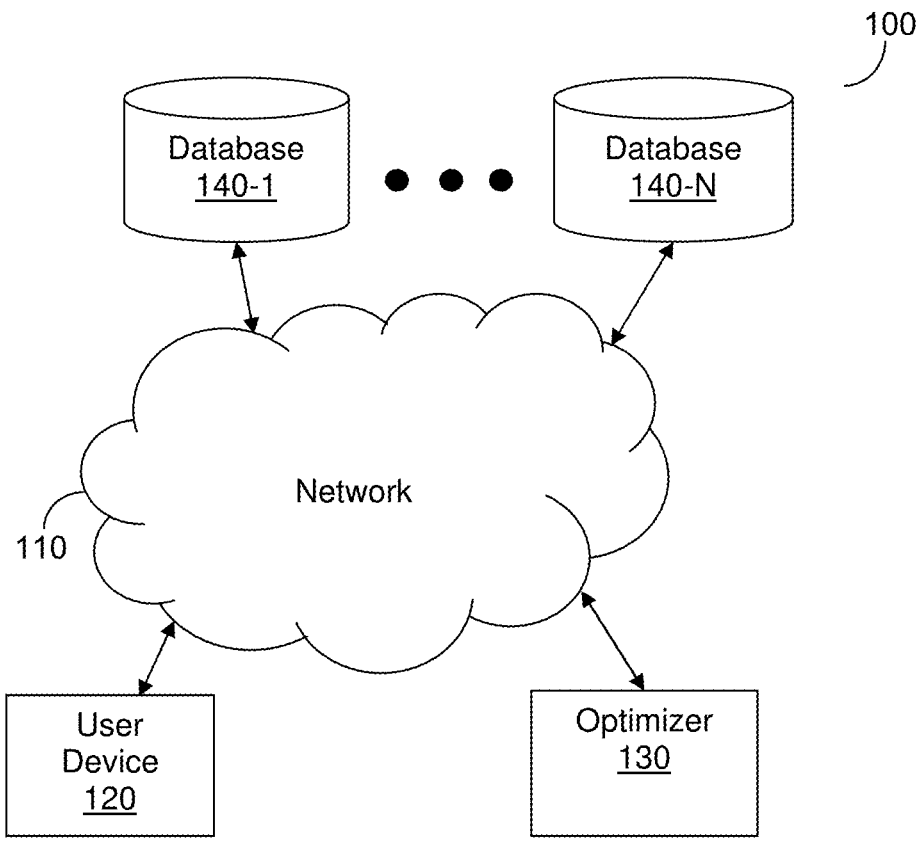
FIG. 1 is a network diagram utilized to describe various disclosed embodiments.

It is important to note that the embodiments disclosed herein are only examples of the many advantageous uses of the innovative teachings herein. In general, statements made in the specification of the present application do not necessarily limit any of the various claimed embodiments. Moreover, some statements may apply to some inventive features but not to others. In general, unless otherwise indicated, singular elements may be in plural and vice versa with no loss of generality. In the drawings, like numerals refer to like parts through several views.

The various disclosed embodiments include a method and system for improved occupancy simulations and for generating analytics based on such simulations. Input data is provided to a scheduler configured to generate synthetic schedules defined with respect to actors performing activities within a space. The synthetic schedules are provided to a simulation engine, which runs simulations of different activities within the space according to the synthetic schedules. Based on outcomes of the simulations, analytics are generated, and recommendations are provided on how to optimize the allocation of spaces to people and tasks. The recommendations may be provided to a user via a user device, and may be organized into a dashboard.

The scheduler, as described herein, effectively provides synthetic schedules indicating which activities are performed by different actors and when each activity is performed. Based on these activities and timing, the engine is configured to run a simulation as an aggregation of modular and atomic people actions based on rules for performing activities. In other words, the scheduler provides synthetic schedules indicating what to do, where, and when, while the engine evaluates it by enacting the schedule in a specific location to account for the movement of people in space.

The disclosed embodiments further include techniques for improving computer performance related to execution of the scheduler and simulation engine. To this end, in an embodiment, the scheduler executes two or more-sub-algorithms executed using a waterfall approach in which the results of one sub-algorithm are fed as inputs into another to schedule these activities sequentially in an order of priority. The scheduler utilizes a taxonomy of activities (e.g., group, individual, scheduled, unscheduled, work-related, leisure) in order to determine the order of priority.

In a further embodiment, such sub-algorithms include a group activity sub-algorithm in which group activities performed by groups of actors are scheduled as well as an individual activity sub-algorithm in which individual activities performed by individual actors are scheduled based on group activities of respective groups to which each actor belongs. In yet a further embodiment, the sub-algorithms further include a break activity sub-algorithm which utilizes results of the group activity sub-algorithm as inputs and outputs a break activity schedule which is used as inputs to the individual activity sub-algorithm. By utilizing this waterfall approach, the time required to perform scheduling as well as potential scheduling conflicts between actors (e.g., actors occupying the same space or otherwise failing to abide by space requirements) are reduced. The order with which different activity types are scheduled can be specified by the user.

Synthetic schedules generated by the scheduler are provided to the simulation engine in order to run simulations. The simulation engine may be configured with artificial intelligence for each actor, and has each actor behave in accordance with a respective role defined by each synthetic schedule. Such artificial intelligence is a protocol defining how the actor acts when subject to a given schedule and acting within a given space. The result is a simulation including movements of actors and interactions between actors. Such interactions may be defined with respect to actors being near each other and may include, but are not limited to, social distancing (or lack thereof), meetings, encountering other actors in halls or otherwise while moving around, queues (e.g., lines for a bathroom or other utilities), workplace experience (e.g., a number of actors moving past an actor in a given day while the actor is stationary), combinations thereof, and the like.

Particular uses of the disclosed embodiments allow for providing space utilization for purposes such as, but not limited to, improving space planning, improving personnel productivity, improving safety, maximizing efficiency of space utilization, and the like. Such improvements may be used in locations such as, but not limited to, process-driven facilities, and the like. Example of process-driven facilities include, but are not limited to, office spaces, hospitals, distribution centers, manufacturing plants, and the like. These locations may be indoor or outdoor, and are not limited to locations having tangible boundaries such as walls and doors.

The disclosed embodiments may also be utilized to aid in space utilization based on emerging requirements vis-a-vis placement of people relative to each other. As a non-limiting example, the disclosed embodiments may be utilized to maximize proper social distancing between employees (e.g., by maintaining a minimum distance of 6 feet between employees as suggested during the COVID-19 pandemic). Accordingly, the disclosed embodiments may be utilized to help reactivate facilities' operations during or after a pandemic.

Specifically, the disclosed embodiments provide improved simulations of space utilization which may be provided more efficiently with respect to times of simulations and reducing conflicts during simulations. This, in turn, allows for efficiently and accurately determining analytics representing which simulation results (and, consequently, which input parameters) result in optimal space utilization.

Further, since the disclosed embodiments provide reduced time of simulations, the disclosed embodiments may be utilized to effectively test real-time scenarios, thereby providing analytics suitable for informing operational strategies as processes are conducted in the space. Moreover, the results of these real-time simulations may be utilized to determine changes to operations which can also be implemented in real-time, thereby allowing for adjusting space utilization based on changing demand and use.

By providing such improved simulations, the disclosed embodiments allow for improving processes in process-driven facilities. More specifically, simulation results may be utilized to determine statistics related to various parameters which may be relevant to improving processes and used to select which facility configurations will yield optimal results with respect to these parameters. Further, the disclosed embodiments allow for identifying simulations that minimize contact between people working in process-office spaces and other facilities in which excessive contact between people can be undesirable due to, for example, distractions, necessary health measures, and the like. Thus, the disclosed embodiments may also be used to improve work experience and productivity of employees or other occupants of a facility.

FIG. 1 shows an example network diagram 100 utilized to describe the various disclosed embodiments. In the example network diagram 100, a user device 120, an optimizer 130, and a plurality of databases 140-1 through 140-N (hereinafter referred to individually as a database 140 and collectively as databases 140, merely for simplicity purposes) are communicatively connected via a network 110.

The network 110 may be, but is not limited to, a wireless, cellular or wired network, a local area network (LAN), a wide area network (WAN), a metro area network (MAN), the Internet, the worldwide web (WWW), similar networks, and any combination thereof.

The user device 120 may be, but is not limited to, a personal computer, a laptop, a tablet computer, a smartphone, a wearable computing device, or any other device capable of receiving and displaying visual data for dashboards and other data. The user device 120 may be configured to receive visual data for dashboards and other data related to simulations run by the optimizer 130, and to display such data.

The optimizer 130 is configured to run simulations as described herein. In particular, the optimizer 130 is configured to obtain input data from the databases 140, the user device 120, or both, and to run simulations based on that input data. The input data may be submitted to the databases 140 via the user device 120, or may be provided directly to the optimizer 130.

In some implementations, the databases 140 may further store dynamic data related to real-time properties of people moving within the space such as, but not limited to, real-time location services data. Using such dynamic data allows for adapting simulations to changes in activity which differ from assumptions built into the scheduler and simulation engine models, thereby improving accuracy of scheduling and simulation activities.

In order to provide simulations and analytics as described herein, the optimizer 130 is configured to schedule and run such simulations. An example diagram illustrating potential logical components of the optimizer 130 is now described with respect to FIG. 2.

Figure 2:
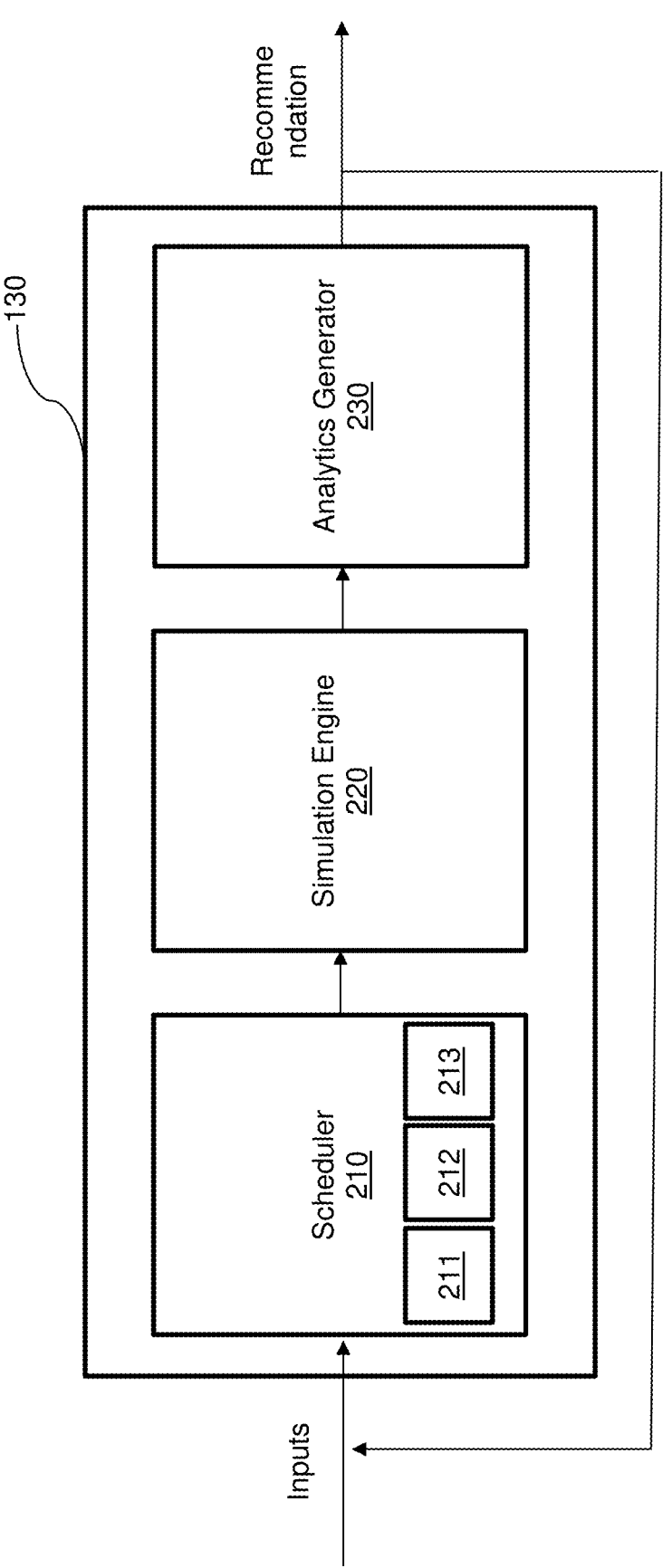
FIG. 2 is a flow diagram illustrating logical components of an optimizer according to an embodiment.

FIG. 2 is a flow diagram illustrating logical components of an optimizer 130 according to an embodiment. In the example flow diagram shown in FIG. 2, the optimizer 130 includes a scheduler 210, a simulation engine 220, and an analytics generator 230.

The scheduler 210 accepts initial inputs such as, but not limited to, space data, persona data, and work pattern data. The space data defines potential characteristics of the space or spaces in which the simulation is to be run and may include, but is not limited to, layout data, spatial location data (e.g., different types of rooms or groups of rooms), combinations thereof, and the like. The layout data indicates a layout of a space in which the simulation is to be run. The persona data indicates behavior of each actor to act within the space as defined, for example, with respect to which activities are to be performed by each actor and how many instances of each activity are to be performed by each actor. The work pattern data defines the different types of activities that are relevant to the simulation, for example, using constraints of activities and locations in which the activities occur within the space.

The scheduler 210 is configured to output a schedule including positions and corresponding times for those positions for each actor which performs activities within the space. Each activity may be a computer programming object as described herein, which directs actors to achieve a specific goal, such as reach a target or interact with other people or the environment. To this end, the scheduler 210 is configured with rules for scheduling activities that define the effects each activity has on scheduling. Such rules may include, but are not limited to, time durations representing typical or otherwise expected times of activities (e.g., a formal meeting may have a time duration of 30 minutes), restrictions on certain activities occurring at specific times of day (e.g., a lunch break activity may occur only between 11 AM and 2 PM), restrictions preventing different activities from being performed in the same portion of the space at the same time, restrictions preventing an actor from participating in two or more activities at once, restrictions on the amount of people that may be performing activities within the same portion of the space at the same time, restrictions related to privacy for certain activities (e.g., a rule specifying that a subclass of activity known to be private cannot be performed at the same time and in the same portion of the space as any other activity), combinations thereof, and the like. In an example implementation, such rules may be realized as a class of activity specifications.

In an embodiment, the scheduler 210 executes multiple scheduling sub-algorithms and utilizes a waterfall approach in which output of one sub-algorithm is utilized as input to another sub-algorithm so as to improve processing and results of subsequent sub-algorithms. In the example embodiment shown in FIG. 2, the scheduler 210 executes a group activity sub-algorithm 211 followed by a break activity sub-algorithm 212 and then an individual activity sub-algorithm 213. It should be noted that other orders of sub-algorithms may be equally utilized, and that other sets of sub-algorithms may be utilized in accordance with at least some disclosed embodiments.

In an embodiment, the group activity sub-algorithm 211 is configured to schedule group activities based on groups of actors and any applicable constraints. The break activity sub-algorithm 212 is configured to provide each actor with one or more break activities during periods of time in which the actor is not scheduled for group activities in accordance with any applicable constraints. In an example implementation, such break activities may include a 30 minute lunch break and two 15 minute coffee breaks. The individual activity sub-algorithm is configured to provide each actor with all other activities to be performed alone, i.e., without requiring other members of any groups to be present.

In an example implementation, each sub-algorithm of the scheduler 210 may solve a constraint satisfaction problem including binary decision variables and a set of constraints determined based on the objects involved in the simulation and the rules for performance of activities (e.g., as defined in the activity specifications). As a non-limiting example, one binary decision value solved by the group activity sub-algorithm 213 may indicate true or false, where true represents an actor "employee #100" participates in a group activity "formal work meeting #1" and false represents the actor "employee 100" not participating in the group activity "formal work meeting 1." Other techniques can also be used to solve the scheduling task such as, but not limited to constraint satisfaction, optimization, machine learning, and deep learning methods.

In this regard, it has been identified that activities performed in process-driven facilities are often performed in groups such that results of scheduling group activities may be utilized to more accurately and more efficiently schedule activities of individuals in each group. As a result, the disclosed waterfall approach provides an approach in which the results of the group activity sub-algorithm 211 may be utilized to more quickly perform break and individual activity sub-algorithms 212 and 213, and may also reduce the number of conflicts encountered during scheduling. Reducing the number of conflicts encountered during scheduling, in turn, allows for more efficiently running simulations by excluding potential simulations based on schedules which would fail to meet any applicable constraints.

It has further been identified that break activities typically have fewer constraints than group activities but have more constraints than individual activities. As a result, scheduling individual activities before break activities may result in more conflicts such that break activities cannot be scheduled in accordance with applicable constraints, as does scheduling group activities before scheduling break activities and individual activities.

The simulation engine 220 accepts synthetic schedules generated by the scheduler as inputs and is configured to run a simulation based on each synthetic schedule. In an example implementation, each simulation is defined and run with respect to certain computer programming objects. The objects used for a simulation fall into one or more computer programming classes such as, but not limited to, activity, space, spot, actor, persona, and event.

A space is a setting in which activities are performed by the actors. The space may be modeled after a real world or virtual location having two-dimensional (2D) or three-dimensional (3D) spatial properties (e.g., length and width; length, width, and depth; other expressions of 2D or 3D dimensions; etc.). The space can also be modelled as a graph, where each spatial location (including but not limited to rooms, open spaces, corridors, desks, equipment, etc.) constitutes nodes in the graph and the links constitute the connection between spatial locations. The space may include multiple spots, where each spot is a subdivision of the space which may be occupied by one or more actors. As a non-limiting example, a spot within a space that is an office may be a meeting room or a specific portion of a meeting room (e.g., a specific seat in the meeting room). A space may further include physical boundaries such as walls, floors, ceiling, and the like. The space and all actors to perform activities within the space during a simulation, as well as activity specifications for activities to be performed within the space, may be aggregated into a workplace class.

Different subclasses of spots may include, for example but not limited to, kitchen, meeting room, open space, collaborative area, and the like. Different subclasses of spots may be subject to different restrictions. As a non-limiting example, a meeting room may be prevented from holding a reserved spot (i.e., a spot which has been designated as belonging to a particular actor) while an open space may hold such a reserved spot. The restrictions on different classes of spots may be predetermined, and may vary depending on the use of the simulations.

An actor is an entity such as, but not limited to, a person, a robot, and the like, which performs activities and may move within the space. The actor may behave in accordance with a persona, which defines the movements and activities the actor performs throughout a session. Activities may be goal-oriented actions and are defined with respect to a set of actors that each perform the activity and a duration of the activity. Example subclasses of actions may include, but are not limited to, move (e.g., move an actor from a first point within the space to a second point within the space), stay (e.g., an actor stays at a given point within the space), leave (e.g., remove an actor from the space), and the like.

The output of the simulation engine 220 may be a set of simulation outcomes, where each simulation outcome indicates all interactions among actors in a space for a respective synthetic schedule. An interaction may occur when two or more actors cross paths, where crossing paths may be defined with respect to, for example, a distance between actors, any physical boundaries between actors (e.g., a wall), both, and the like. As a non-limiting example, two actors may cross paths when the actors are within a threshold distance of each other on the same floor and there is no wall between them.

Figure 6:
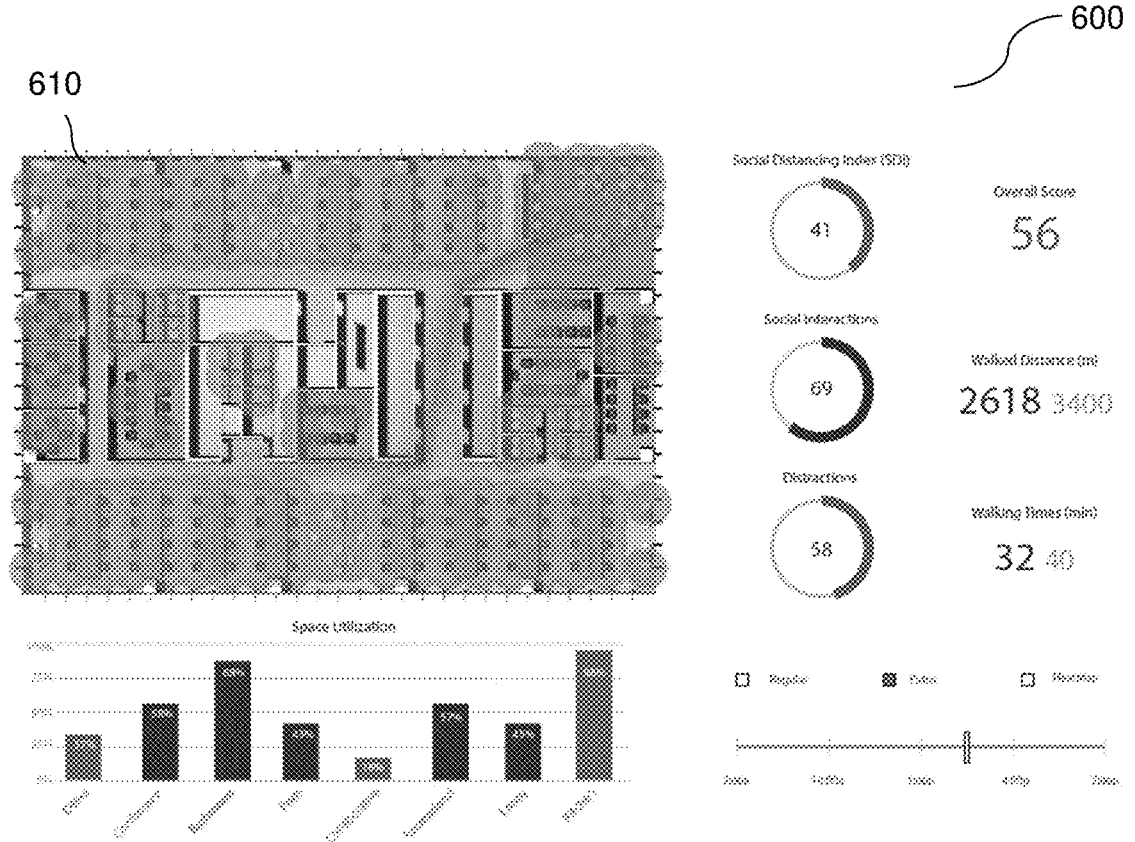
FIG. 6 is an illustration of a dashboard showing a simulation outcome.

A non-limiting example simulation outcome is depicted in FIG. 6. FIG. 6 is an illustration 600 of a simulation outcome as shown in a dashboard. In the illustration 600, a heat map illustrates the movements of one or more actors (not shown) moving within a space 610 throughout the simulation.

Returning to FIG. 2, in an embodiment, the simulation engine 220 may be configured to run one or more coroutines. Each coroutine is a process that runs in the background of the simulation. The coroutines at least include artificial intelligence for each actor in the simulation. The artificial intelligence for each actor is a protocol configured to trigger activities for the actor based on the schedules generated by the scheduler 210 in the space provided as inputs to the scheduler and a time clock representing the current time throughout the simulation.

The coroutines may further include coroutines for providing information to be used for generating particular analytics and, therefore, the particular coroutines that are utilized may depend on desired information to be obtained through simulation. Non-limiting examples of such coroutines may include, but are not limited to, exposure, interaction, queue, social distancing, social interactions, distraction, position, total distance moved, and time spent moving. Further, in some implementations, the information-providing coroutines may only provide position and proximity data, and such data may be subsequently analyzed during analytics generation in order to provide additional information as needed. Limiting the number and complexity of coroutines being run during simulations to only coroutines needed to determine other required information later allows for increasing computational efficiency of the simulations, which in turn improves scalability.

An exposure coroutine may maintain a timer tracking the amount of time each actor is exposed to another actor (e.g., an amount of time during which an interaction between the actors occurs). An interaction instance coroutine may maintain, for each pair of two actors among all actors, a counter of a number of times an interaction occurs between the two actors. A queue coroutine may maintain queues when certain spots (e.g., restrooms, kitchens, etc.) are occupied by one or more actors attempting to perform activities in those spots such that other actors form a queue outside of the spot (e.g., a line for using the restroom). A social distancing coroutine may determine a social distancing index representing a total amount of time in which an actor appropriately social distanced (i.e., stayed at least a threshold distance away from) from other actors. A social interactions coroutine may maintain a counter of a number of times an actor has ad-hoc interactions with other actors (e.g., bumping into another actor in a hallway). A distraction coroutine may maintain a counter of a number of times an actor may have been distracted due to another actor coming within a predetermined distance associated with distraction. A position coroutine tracks the position (e.g., as expressed in X and Y coordinates) of an actor at each unit of time during the simulation. A total distance moved coroutine maintains a value tracking the total distance moved by an actor throughout a simulation. A time spent moving coroutine maintains a value tracking the total amount of time in which an actor moves throughout a simulation.

Outputs of the simulation engine 220 are provided to the analytics generator 230 to be used as inputs. In an embodiment, outputs of the analytics generator 230 may be provided to the scheduler 210 as feedback. In this regard, the simulations may be run iteratively, with results of one simulation and optimization being analyzed to create inputs to a next cycle of simulation and optimization. This iterative testing may be utilized to improve simulation outcomes, to provide more accurate analytics, both, and the like.

The analytics generator 230 is configured to generate analytics based on the output of the simulation engine 220. The analytics to be generated may be predetermined, for example, based on user inputs defining goals of the simulations. In an embodiment, the analytics are generated based on outputs of the coroutines run by the simulation engine 220. The analytics may indicate, for example, which schedule, space design, or space-people-task allocation strategies are optimal for certain criteria based on the simulation results (e.g., which simulations result in the lowest total time moving, which simulations minimize time in which social distancing is not adhered to, which simulations result in the minimal amount of distraction, etc.).

The analytics may be utilized to generate insights which may be provided as recommendations to a user, which in turn may be further analyzed (for example, by a workplace manager) to inform space utilization and other decisions. In some embodiments, the results of those space utilization decisions may be utilized as inputs for subsequent iterations of simulations. Because the disclosed embodiments improve speed of processing simulations and reduce the number of simulations generated based on conflicting schedules, user experience for such additional simulations are further improved.

The outputs of the analytics engine 230 may therefore include one or more recommendations for modifying the space utilization and allocation of people to spaces or tasks. Such recommendations may be based on, for example, the analytics and one or more desired areas of improvement. In some implementations, the recommendations may be provided to a user via, for example, a graphical user interface (e.g., a dashboard). In other implementations, the recommendations may be provided to users via other mechanisms such as, but not limited to, notifications, short message service (SMS) messages, combinations thereof, and the like. In some embodiments, a user may select changes to the space utilization from among the recommendations, and subsequent iterations of the simulation may be performed accordingly.

The recommendations may be based on multiple iterations of the simulation involving different space setups, actors, and activities. Each iteration may include running one or more simulations. In this regard, it is noted that the scheduler 210 may output multiple schedules in a given iteration, and the simulation engine 220 may run multiple simulations in parallel during the iteration. Subsequent iterations may be improved based on the results of the multiple simulations performed in prior iterations.

It should be noted that a software development kit (SDK) or other foundational software is not depicted in FIG. 1 or 2, but that the optimizer 130 may be realized using a SDK in accordance with the disclosed embodiments. Such a SDK may include, but is not limited to, foundational software required to build and support domain-dependent logic algorithms and configurations as well as software packages providing classes, methods, and algorithms for generating, for example, synthetic schedules and activity processes in accordance with the disclosed embodiments.

Figure 3:
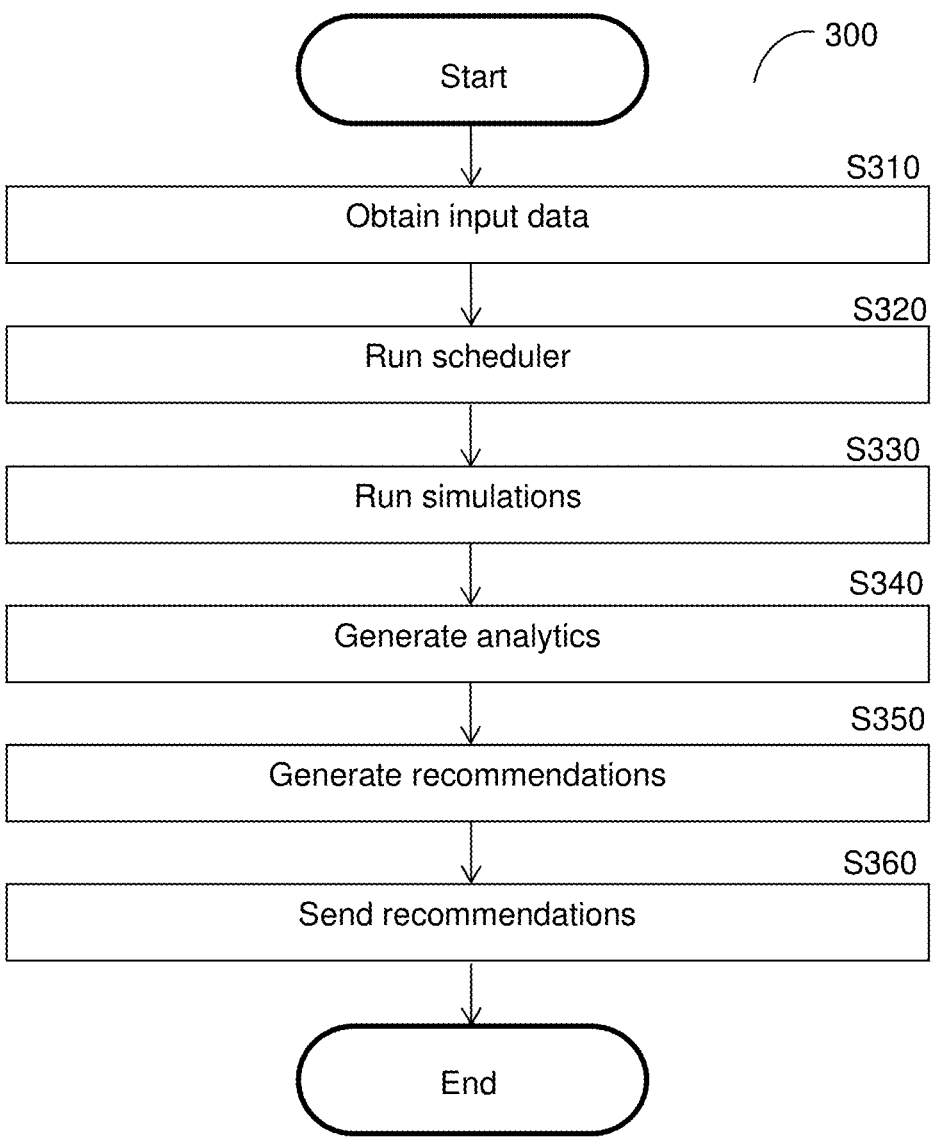
FIG. 3 is a flowchart illustrating a method for improved occupancy simulations according to an embodiment.

FIG. 3 is a flowchart 300 illustrating a method for optimizing simulations used for providing optimal space utilization according to an embodiment. In an embodiment, the method is performed by the optimizer 130, FIG. 1.

At S310, input data is obtained. The input data may be obtained from, for example, the user device 120, the databases 140, or both.

The input data may include, but is not limited to, space characteristics data, persona data, work pattern data, a combination thereof, and the like. The space characteristics data describes potential characteristics of the space in which various actors perform activities and may include, but is not limited to, layout data (e.g., a two-dimensional floor plan, a three-dimensional model, etc.), spatial location data (e.g., features of spatial locations such as rooms or portions thereof included in the space), both, and the like. The spatial location data may further define different types or classes of spatial locations such as, but not limited to, different types of rooms (e.g., private office rooms, open workspace rooms, conference or other meeting rooms), different sizes of rooms (e.g., sizes to accommodate different numbers of maximum occupancy), combinations thereof, portions thereof, and the like.

The persona data defines activities performed by each actor which will be acting within the space. In an example implementation, the persona data may be group persona data indicating a number of persons in the group, types of work patterns performed by people in the group, a number of each type of work pattern the group will perform in a given period of time, combinations thereof, and the like. The work pattern data defines descriptions of the activities performed by each actor and locations within the space where those activities occur. As a non-limiting example, work pattern data for a workplace may include specifications of a formal work meeting such as duration, number of participants, a subspace in which the meeting will occur, and the like. The inputs may further include goals of the simulations, for example, goals defined with respect to certain desired analytics to be generated based on the simulations. As a non-limiting example, an input goal may be to minimize time in which actors are not socially distanced from each other (i.e., time in which actors are within a threshold distance of other actors) such that desired analytics include analytics related to social distancing.

At S320, the input data is input to a scheduler (e.g., the scheduler 210, FIG. 2) in order to generate synthetic schedules for each actor indicated in the input data. In an embodiment, the scheduler is configured to perform multiple sub-algorithms organized using a waterfall approach such that the results of one sub-algorithm are used as inputs to another sub-algorithm. In a further embodiment, the sub-algorithms include at least a group activity sub-algorithm and an individual activity sub-algorithm, and the outputs of the group activity sub-algorithm are utilized by the individual activity sub-algorithm, either directly (i.e., by inputting such outputs of the group activity sub-algorithm to the individual activity sub-algorithm) or indirectly (e.g., by inputting such outputs of the group activity sub-algorithm to a break activity sub-algorithm whose outputs are input to the individual activity sub-algorithm).

Figure 4:
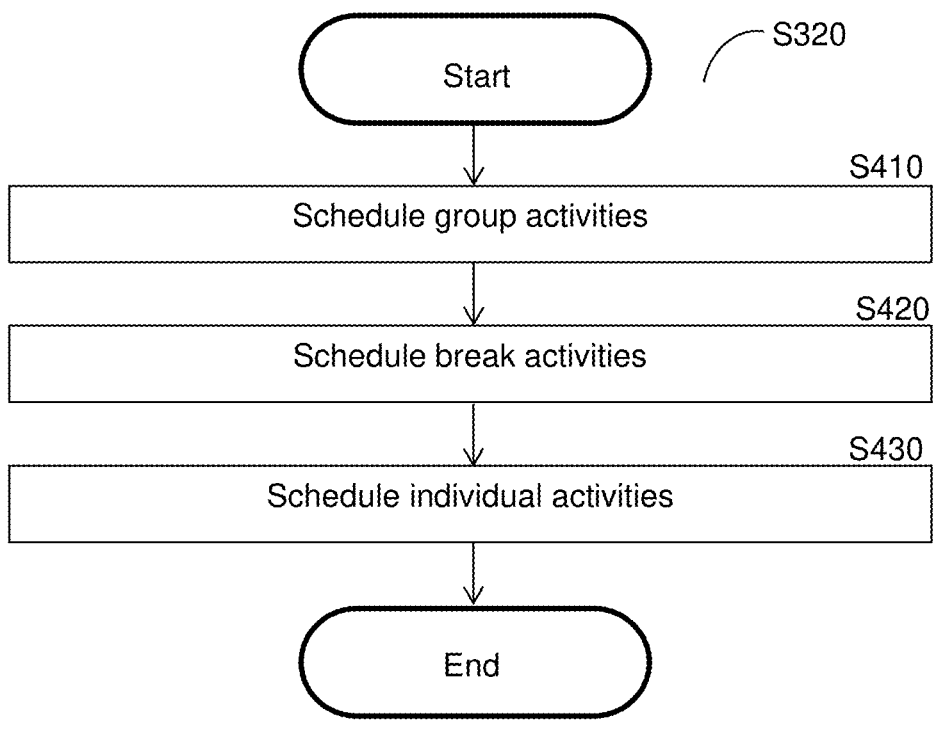
FIG. 4 is a flowchart illustrating scheduling occupancy simulations according to an embodiment.

FIG. 4 is a flowchart S320 illustrating scheduling occupancy simulations according to an embodiment.

At S410, group activities are scheduled. The group activities are activities performed by a group of actors. The group activities are performed based on input data including space data indicating potential characteristics of the space, persona data indicating behavior of each actor performing activities within the space, and work pattern data defining the activities performed within the space.

At optional S420, break activities are scheduled. The break activities are individual activities predefined as break activities and define breaks in performing normal processes (e.g., work-related processes). In an embodiment, the break activities are scheduled based on the input data as well as the output of S410. Thus, the break activities are effectively scheduled around the group activities such that the break activities are scheduled in locations of the space during times in which group activities are not being performed.

At S430, any remaining individual activities are scheduled. In an embodiment, the remaining individual activities are scheduled based on the input data as well as the output of S410, S420, or both. Thus, the individual activities are effectively scheduled around the group activities such that the individual activities are scheduled in locations of the space during times in which group activities are not being performed, and the individual activities may be further scheduled around the break activities.

As noted above, the waterfall approach to the respective sub-algorithms for group and individual activities provides faster processing of scheduling and results in fewer schedules including impermissible conflicts. As a result, simulations may be run more quickly, and simulations based on impossible schedules may be skipped. The result is improved computer processing as well as improved user experience. It should be noted that the group activities, break activities, and remaining individual activities are described as being scheduled in a particular order in FIG. 4 for illustrative purposes but that, in at least some embodiments, the activities may be scheduled in a different order.

Returning to FIG. 3, at S330, based on the synthetic schedules generated by the scheduler, simulations are run, for example, as described above with respect to the simulation engine 220, FIG. 2. In an embodiment, S330 further includes running multiple coroutines as part of the simulation. The coroutines at least include a coroutine responsible for controlling activities performed by each actor, and may further include coroutines for providing information to be used in analytics generation as described above.

At S340, analytics are generated based on the outcomes of the simulations. The analytics may be generated based on input goals provided by a user (e.g., a user of the user device 120, FIG. 1).

At optional S350 and S360, recommendations are generated and then sent (e.g., to the user device 120, FIG. 1). The recommendations may include, but are not limited to, recommendations for improving space utilization, process efficiency, and people experience (e.g., improving the allocation of spaces to people and activities over time). The recommendations may be determined based on the analytics and one or more rules for recommendations. Such rules may be created based on user inputs and define desirable results for space utilization in terms of potential analytics such as, but not limited to, minimizing interactions aside from scheduled activities, minimizing exposure between actors, minimizing time during which actors are not socially distanced, and the like.

In some implementations, the recommendations, the analytics, or both, may be provided via visual content such as a dashboard. The dashboard may include, but is not limited to, the simulations, the analytics, both, and the like. The dashboard may be displayed as a graphical user interface allowing the user to make changes to the inputs for the simulation (i.e., based on space utilization decisions made by the user after viewing the analytics) and to request that additional simulations be run based on the updated inputs. To this end, in some embodiments (not shown), after S360, execution may continue with S310 based on inputs provided after sending of the dashboard.

Figure 5:
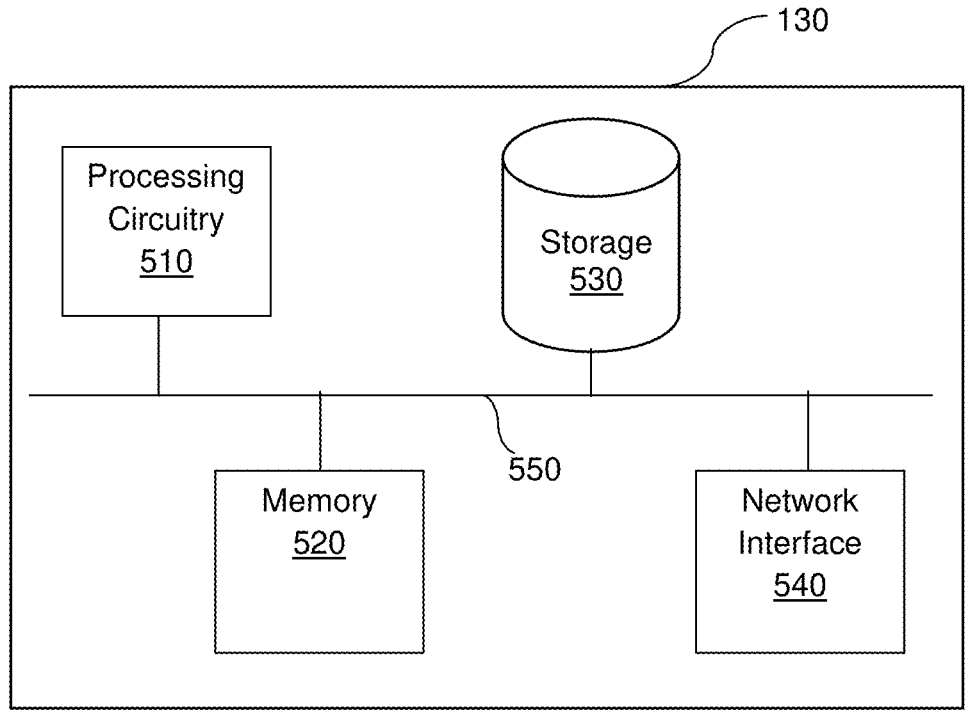
FIG. 5 is a schematic diagram illustrating hardware components by which the optimizer may be realized according to an embodiment.

FIG. 5 is a schematic diagram illustrating hardware components by which the optimizer 130 may be realized according to an embodiment.

In the example diagram shown in FIG. 5, the optimizer 130 includes a processing circuitry 510 coupled to a memory 520, a storage 530, and a network interface 540. In an embodiment, the components of the optimizer 130 may be communicatively connected via a bus 550.

The processing circuitry 510 may be realized as one or more hardware logic components and circuits. For example, and without limitation, illustrative types of hardware logic components that can be used include field programmable gate arrays (FPGAs), application-specific integrated circuits (ASICs), Application-specific standard products (ASSPs), system-on-a-chip systems (SOCs), graphics processing units (GPUs), tensor processing units (TPUs), general-purpose microprocessors, microcontrollers, digital signal processors (DSPs), and the like, or any other hardware logic components that can perform calculations or other manipulations of information.

The memory 520 may be volatile (e.g., random access memory, etc.), non-volatile (e.g., read only memory, flash memory, etc.), or a combination thereof.

In one configuration, software for implementing one or more embodiments disclosed herein may be stored in the storage 530. In another configuration, the memory 520 is configured to store such software. Software shall be construed broadly to mean any type of instructions, whether referred to as software, firmware, middleware, microcode, hardware description language, or otherwise. Instructions may include code (e.g., in source code format, binary code format, executable code format, or any other suitable format of code). The instructions, when executed by the processing circuitry 510, cause the processing circuitry 510 to perform the various processes described herein.

The storage 530 may be magnetic storage, optical storage, and the like, and may be realized, for example, as flash memory or other memory technology, compact disk- read only memory (CD-ROM), Digital Versatile Disks (DVDs), or any other medium which can be used to store the desired information.

The network interface 540 allows the optimizer 130 to communicate with, for example, the user device 120, the databases 140, or both.

It should be understood that the embodiments described herein are not limited to the specific architecture illustrated in FIG. 5, and other architectures may be equally used without departing from the scope of the disclosed embodiments. As a non-limiting example, the optimizer 130 may be realized as one or more software components (e.g., software containers, virtual machines, etc.) without departing from the scope of the disclosure. The hardware running such software components may be included in a single system (as depicted in FIG. 5).

The various embodiments disclosed herein can be implemented as hardware, firmware, software, or any combination thereof. Moreover, the software is preferably implemented as an application program tangibly embodied on a program storage unit or computer readable medium consisting of parts, or of certain devices and/or a combination of devices. The application program may be uploaded to, and executed by, a machine comprising any suitable architecture. Preferably, the machine is implemented on a computer platform having hardware such as one or more central processing units ("CPUs"), a memory, and input/output interfaces. The computer platform may also include an operating system and microinstruction code. The various processes and functions described herein may be either part of the microinstruction code or part of the application program, or any combination thereof, which may be executed by a CPU, whether or not such a computer or processor is explicitly shown. In addition, various other peripheral units may be connected to the computer platform such as an additional data storage unit and a printing unit. Furthermore, a non-transitory computer readable medium is any computer readable medium except for a transitory propagating signal.

All examples and conditional language recited herein are intended for pedagogical purposes to aid the reader in understanding the principles of the disclosed embodiment and the concepts contributed by the inventor to furthering the art, and are to be construed as being without limitation to such specifically recited examples and conditions. Moreover, all statements herein reciting principles, aspects, and embodiments of the disclosed embodiments, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

It should be understood that any reference to an element herein using a designation such as "first," "second," and so forth does not generally limit the quantity or order of those elements. Rather, these designations are generally used herein as a convenient method of distinguishing between two or more elements or instances of an element. Thus, a reference to first and second elements does not mean that only two elements may be employed there or that the first element must precede the second element in some manner. Also, unless stated otherwise, a set of elements comprises one or more elements.

As used herein, the phrase "at least one of" followed by a listing of items means that any of the listed items can be utilized individually, or any combination of two or more of the listed items can be utilized. For example, if a system is described as including "at least one of A, B, and C," the system can include A alone; B alone; C alone; 2A; 2B; 2C; 3A; A and B in combination; B and C in combination; A and C in combination; A, B, and C in combination; 2A and C in combination; A, 3B, and 2C in combination; and the like.

What is claimed is:

1. A method for improved occupancy simulations, comprising:

executing a scheduler algorithm based on input data in order to output a plurality of synthetic schedules, wherein the input data includes space data, persona data, and work pattern data, wherein the scheduler algorithm includes a plurality of sub-algorithms executed according to an order of priority to output the plurality of synthetic schedules, wherein at least an output of one of the plurality of sub-algorithms is input to another subsequent sub-algorithm of the plurality of sub-algorithms, wherein executing the scheduler algorithm further comprises:

executing a first sub-algorithm of the plurality of sub-algorithms to output a first intermediate output;

executing a first individual activity sub-algorithm of at least one individual activity sub-algorithm to output a second intermediate output, wherein the first intermediate output from the first sub-algorithm is provided as input to the first individual activity sub-algorithm;

inputting the plurality of synthetic schedules to a simulation engine; and running a plurality of simulations, via the simulation engine, using the input plurality of synthetic schedules to output a plurality of simulation outcomes, wherein each simulation outcome indicates interactions among actors in a space for a respective synthetic schedule of the plurality of synthetic schedules.

2. The method of claim 1, wherein the plurality of sub-algorithms includes a group activity sub-algorithm and the at least one individual activity sub-algorithm, wherein the first sub-algorithm is the group activity sub-algorithm.

3. The method of claim 2, wherein the plurality of sub-algorithms further includes a break activity sub-algorithm, wherein the output of the group activity sub-algorithm is input to the break activity sub-algorithm, wherein an output of the break activity sub-algorithm is input to the first individual activity sub-algorithm of the at least one individual activity sub-algorithm.

4. The method of claim 1, further comprising:

generating, based on an output of the simulation engine, a plurality of analytics demonstrating interactions between space utilization and actors within a space.

5. The method of claim 4, further comprising:

determining at least one recommendation based on the plurality of analytics; and providing the at least one recommendation to a user via a dashboard of a user interface.

6. The method of claim 4, wherein the simulation engine is further configured to run at least one information-providing coroutine, wherein the plurality of analytics is generated based further on outputs of the at least one information-providing coroutine.

7. The method of claim 6, wherein the at least one information-providing coroutine is configured to provide only position and proximity data.

8. The method of claim 6, wherein the at least one information-providing coroutine is configured to provide data for at least one of: exposure, interaction, queue, social distancing, social interactions, distraction, position, total distance moved, and time spent moving.

9. The method of claim 1, wherein the space data includes spatial location data of a plurality of spatial locations.

10. The method of claim 1, wherein the space data includes layout data of a space for which the simulation is to be run.

11. A non-transitory computer readable medium having stored thereon instructions for causing a processing circuitry to execute a process, the process comprising:

executing a scheduler algorithm based on input data in order to output a plurality of synthetic schedules, wherein the input data includes space data, persona data, and work pattern data, wherein the scheduler algorithm includes a plurality of sub-algorithms executed according to an order of priority to output the plurality of synthetic schedules, wherein at least an output of one of the plurality of sub-algorithms is input to another subsequent sub-algorithm of the plurality of sub-algorithms, wherein executing the scheduled algorithm further comprises;

executing a first sub-algorithm of the plurality of sub-algorithms to output a first intermediate output;

executing a first individual activity sub-algorithm of at least one individual activity sub-algorithm to output a second intermediate output, wherein the first intermediate output from the first sub-algorithm is provided as input to the first individual activity sub-algorithm:

inputting the plurality of synthetic schedules to a simulation engine; and running a plurality of simulations, via the simulation engine, using the input plurality of synthetic schedules to output a plurality of simulation outcomes, wherein each simulation outcome indicates interactions among actors in a space for a respective synthetic schedule of the plurality of synthetic schedules.

12. A system for improved occupancy simulations, comprising:

a processing circuitry; and a memory, the memory containing instructions that, when executed by the processing circuitry, configure the system to:

execute a scheduler algorithm based on input data in order to output a plurality of synthetic schedules, wherein the input data includes space data, persona data, and work pattern data, wherein the scheduler algorithm includes a plurality of sub-algorithms executed according to an order of priority to output the plurality of synthetic schedules, wherein at least an output of one of the plurality of sub-algorithms is input to another subsequent sub-algorithm of the plurality of sub-algorithms, wherein the system is further configured to;

execute a first sub-algorithm of the plurality of sub-algorithms to output a first intermediate output;

execute a first individual activity sub-algorithm of at least one individual activity sub-algorithm to output a second intermediate output, wherein the first intermediate output from the first sub-algorithm is provided as input to the first individual activity sub-algorithm;

input the plurality of synthetic schedules to a simulation engine; and run a plurality of simulations, via the simulation engine, using the input plurality of synthetic schedules to output a plurality of simulation outcomes, wherein each simulation outcome indicates interactions among actors in a space for a respective synthetic schedule of the plurality of synthetic schedules.

13. The system of claim 12, wherein the plurality of sub-algorithms includes a group activity sub-algorithm and the at least one individual activity sub-algorithm, wherein the first sub-algorithm is the group activity sub-algorithm.

14. The system of claim 13, wherein the plurality of sub-algorithms further includes a break activity sub-algorithm, wherein the output of the group activity sub-algorithm is input to the break activity sub-algorithm, wherein an output of the break activity sub-algorithm is input to the first individual activity sub-algorithm of the at least one individual activity sub-algorithm.

15. The system of claim 12, wherein the system is further configured to:

generate, based on an output of the simulation engine, a plurality of analytics demonstrating interactions between space utilization and actors within a space.

16. The system of claim 15, wherein the system is further configured to:

determine at least one recommendation based on the plurality of analytics; and provide the at least one recommendation to a user via a dashboard of a user interface.

17. The system of claim 15, wherein the simulation engine is further configured to run at least one information-providing coroutine, wherein the plurality of analytics is generated based further on outputs of the at least one information-providing coroutine.

18. The system of claim 17, wherein the at least one information-providing coroutine is configured to provide only position and proximity data.

19. The system of claim 17, wherein the at least one information-providing coroutine is configured to provide data for at least one of: exposure, interaction, queue, social distancing, social interactions, distraction, position, total distance moved, and time spent moving.

20. The system of claim 12, wherein the space data includes spatial location data of a plurality of spatial locations.

21. The system of claim 12, wherein the space data includes layout data of a space for which the simulation is to be run.

* * * * *